(12) United States Patent
Andersson

(10) Patent No.: US 6,473,015 B2
(45) Date of Patent: Oct. 29, 2002

(54) CURRENT-STEERING D/A CONVERSION WITH CURRENT SOURCE MISMATCH COMPENSATION

(75) Inventor: Ola Andersson, Linköping (SE)

(73) Assignee: Telefonaktiebolaget LM Ericsson, Stockholm (SE)

(*) Notice: Subject to any disclaimer, the term of this patent is extended or adjusted under 35 U.S.C. 154(b) by 0 days.

(21) Appl. No.: 09/796,363

(22) Filed: Mar. 2, 2001

(65) Prior Publication Data

US 2001/0026232 A1 Oct. 4, 2001

(30) Foreign Application Priority Data

Mar. 6, 2000 (SE) .......................... 0000731-0

(51) Int. Cl.$^7$ .............................. H03M 1/00; H03M 1/10
(52) U.S. Cl. ......................................... 341/136; 341/120
(58) Field of Search ................................. 344/120, 144, 344/136, 119; 341/118, 143, 156

(56) References Cited

U.S. PATENT DOCUMENTS

| | | | |
|---|---|---|---|
| 4,967,197 A | | 10/1990 | Peng |
| 5,105,193 A | | 4/1992 | Vogt et al. |
| 5,162,800 A | | 11/1992 | Ogawara |
| 5,283,580 A | | 2/1994 | Brooks et al. |
| 5,489,902 A | * | 2/1996 | Shyu et al. .................. 341/136 |
| 5,548,288 A | * | 8/1996 | Lueng ......................... 341/136 |
| 5,703,586 A | | 12/1997 | Tucholski |
| 5,790,060 A | * | 8/1998 | Tesch ........................... 341/119 |
| 5,825,317 A | * | 10/1998 | Anderson et al. ........... 341/120 |
| 5,870,044 A | | 2/1999 | Dell'ova et al. |
| 5,982,317 A | * | 11/1999 | Steensgaard-Madsen .... 341/143 |
| 6,166,670 A | * | 12/2000 | O'Shaughnessy ........... 341/136 |

OTHER PUBLICATIONS

J. Jacob Wikner et al., "Modeling of CMOS Digtal–to–Analog Converters for Telecommunication", IEEE Transactions on Circuits and Systems II, vol. 46, No. 5, May 1999, pp. 489–499.

M.J.M. Pelgrom et al., "Matching Properties of MOS Transistors", IEEE J. of Solid–State Circuits, vol. 24, No. 5, pp. 1433–1439, Oct. 1989.

H.J. Schouwenaars et al., "A Low–Power Stereo 16–bit CMOS DIA Converter for Digital Audio", IEEE J. of Solid–State Circuits, vol. 23, No. 6, pp. 1290–1297, Dec. 1988.

* cited by examiner

Primary Examiner—Patrick Wamsley
(74) Attorney, Agent, or Firm—Burns Doane Swecker & Mathis LLP

(57) ABSTRACT

The present invention refers to a method for using a current-steering N-bit D/A converter and to the D/A converter, said converter comprising N binary weighted current sources $SI_k$, k=0, 1, . . . , N−1, connectable to a common output, each current source $SI_k$ comprising $2^k$ unit current sources, $SI_{unit}$, of equal strength connected in parallel, wherein digital input bits $b_i$, i=0, 1, . . . , N−1, $b_{N-1}$ being the most significant bit (MSB), determine which respective current source, $SI_k$, k=0, 1, . . . , N−1, to be connected to the output. The invention features that, during D/A conversion, the current $I_{N-1}$, from the largest current source $SI_{N-1}$ is substituted for a current $\tilde{I}_{N-1}$, where $$\tilde{I}_{N-1} = \left(\sum_{k=0}^{N-2} I_k\right) + I_{unit}$$

in which expression, $I_k$ being the current from the current source $SI_k$, $I_{unit}$ being the current from an additional unit current source.

33 Claims, 4 Drawing Sheets

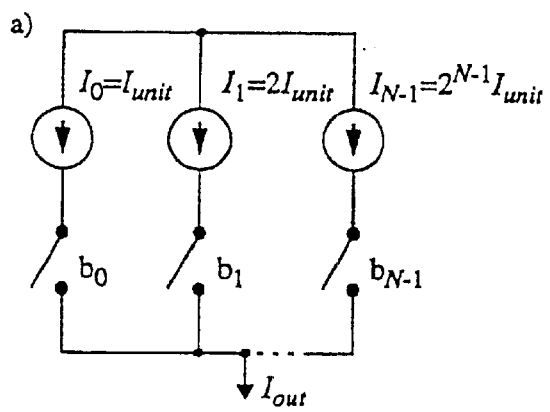
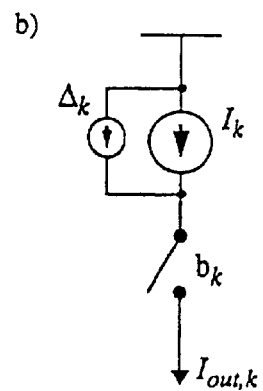
Fig. 1a
Related Art
Fig. 1b
Related Art
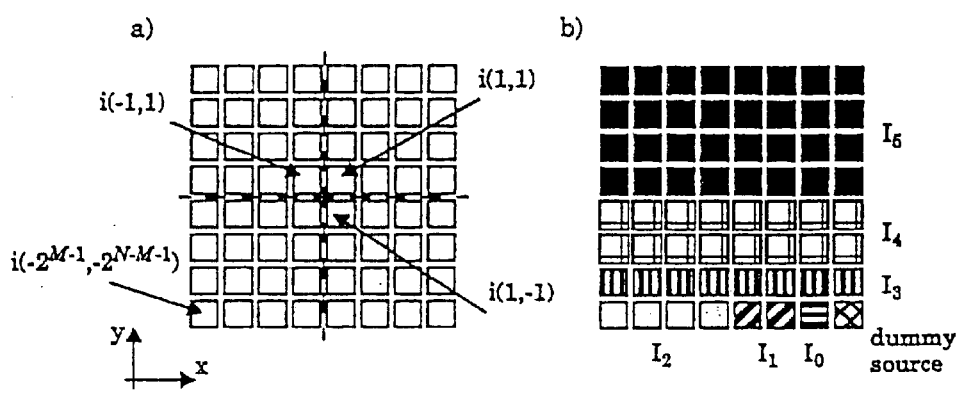
Fig. 2a
Related Art
Fig. 2b
Related Art

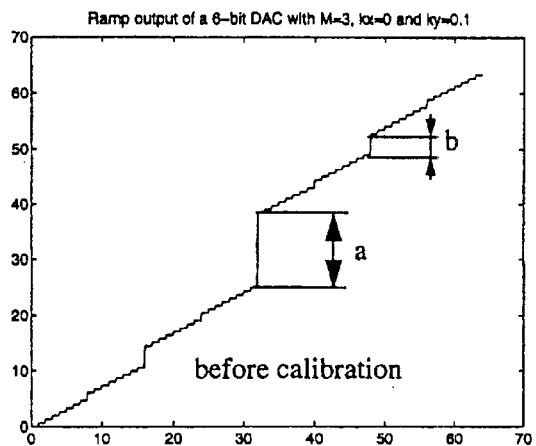 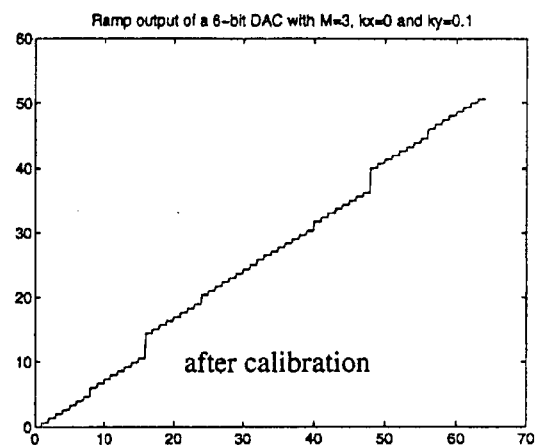
Fig. 3a      Fig. 3b
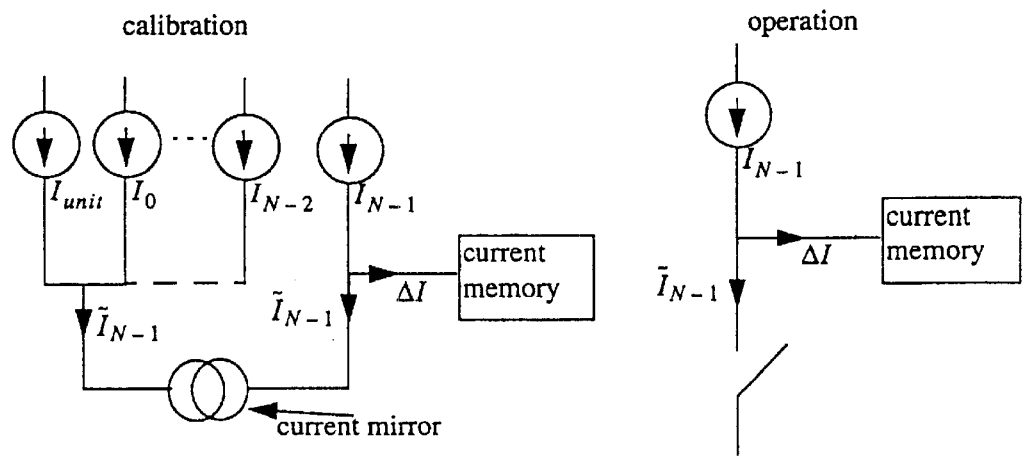
Fig. 4a      Fig. 4b

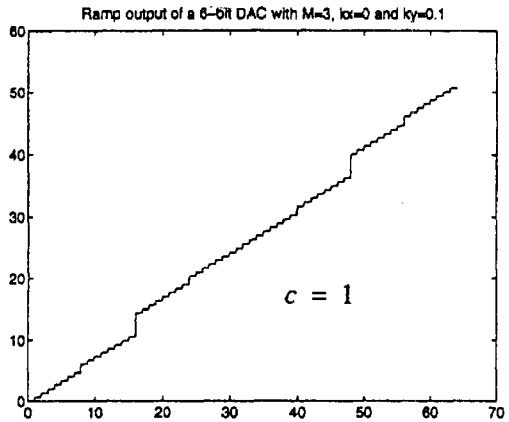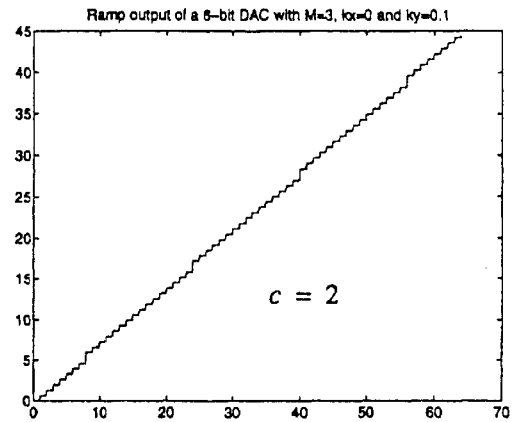
Fig. 5a  Fig. 5b
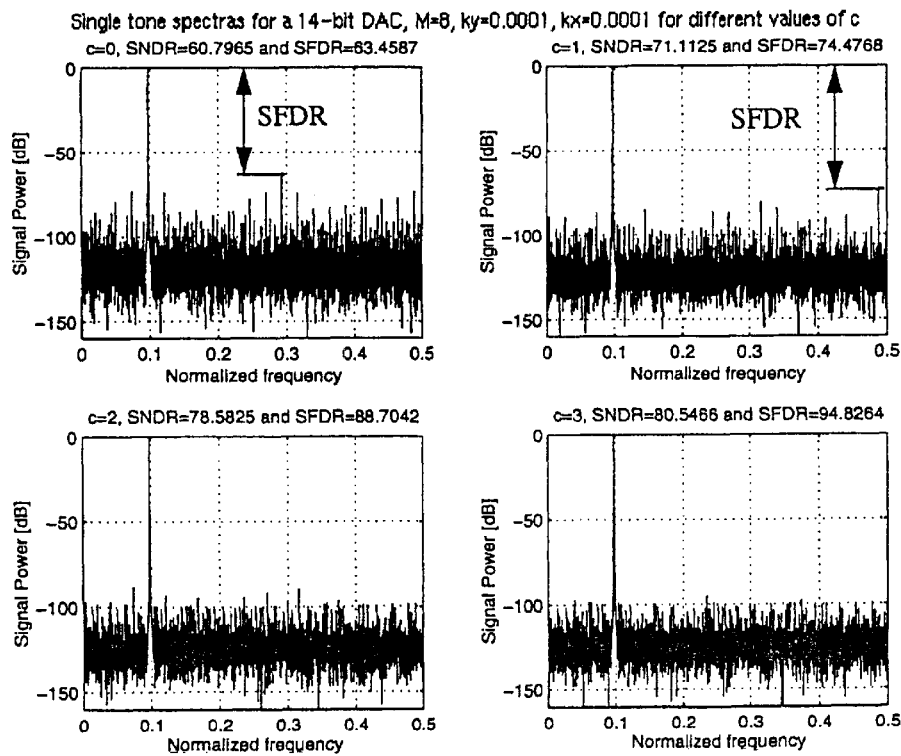
Fig. 7

CURRENT-STEERING D/A CONVERSION WITH CURRENT SOURCE MISMATCH COMPENSATION

TECHNICAL FIELD OF THE INVENTION

The present invention generally relates to improved current-steering D/A conversion, and particularly to an improved method for using a current-steering D/A converter, and to the D/A converter. The method and the converter specifically comprise compensation for deterministic errors due to linearly graded current source mismatch in the D/A converter.

DESCRIPTION OF RELATED ART AND BACKGROUND OF THE INVENTION

D/A converters are commonly used in integrated circuits made by CMOS technology, but may also be used in other types of technologies.

D/A converters can be implemented in a variety of ways. For reasons of technology and precision many converters use parallel-connected current sources whose output is directed either towards an output of the converter or towards a reference terminal. The current sources are typically formed by multiple current mirror whose output transistors are all preferably identical.

Such D/A converters are depicted in for example U.S. Pat. Nos. 5,870,044, 5,162,800, 5,870,044 and 5,105,193.

Mismatch between current sources is a crucial problem in current-steering D/A converters for high-speed and high-resolution applications. Today, complicated layout styles or randomization or dynamic element matching (DEM) techniques are used to solve the problem.

SUMMARY OF THE INVENTION

Accordingly, it is an object of the present invention to provide a method for using a current-steering N-bit D/A converter comprising N binary weighted current sources $SI_k$, k=0, 1, ..., N-1, connectable to a common output, each current source $SI_k$ comprising $2^k$ unit current sources, $SI_{unit}$, of equal strength connected in parallel, wherein digital input bits $b_i$, i=0, 1, ..., N-1, $b_{N-1}$ being the most significant bit (MSB), determine which respective current source, $SI_k$, k=0, 1, ..., N-1, to be connected to the output, which solves, or at least reduces, the problem of mismatch between current sources as depicted above.

It is in this respect a particular object of the invention to provide such a method that is simple, fast, accurate, precise, effective, reliable, and easy to install, and particularly of low cost.

It is yet a further object of the invention to provide such method, which may be implemented by using a minimum of components.

These objects among others are, according to first aspect of the invention, attained by a method, in which, during D/A conversion, the current $I_{N-1}$ from the largest current source $SI_{N-1}$ is substituted for a current $\tilde{I}_{N-1}$, where $$\tilde{I}_{N-1} = \left(\sum_{k=0}^{N-2} I_k\right) + I_{unit}$$

$I_k$ being the current from the current source $SI_k$, and $I_{unit}$ being the current from an additional unit current source.

The method is denoted simple MSB (Most Significant Bit) calibration, as it only compensates for the current $I_{N-1}$ from the largest current source $SI_{N-1}$. The method is preferably implememted such that the D/A converter is calibrated prior to D/A conversion. The calibration comprises that the currents $I_{N-1}$ and $\tilde{I}_{N-1}$ are measured and that the current difference $\Delta I$ between the measured currents is formed and stored. The substitution performed during conversion comprises then that the current $\tilde{I}_{N-1}$ is formed by subtracting the current difference $\Delta I$ from the current $I_{N-1}$ of the largest current source.

The above-mentioned objects among others are, according to a second aspect of the invention, attained by a method, in which, during D/A conversion, the currents $I_{N-1}$, $I_{N-2}$, ..., $I_{N-c}$, from the c largest current sources $SI_{N-1}$, $SI_{N-2}$, $SI_{N-c}$, c being a positive integer larger than 1, are substituted for currents $\tilde{I}_{N-1}, \tilde{I}_{N-2}, \ldots, \tilde{I}_{N-c}$, where $$\tilde{I}_{N-1} = \left(\sum_{k=0}^{N-c-1} I_k\right) + \left(\sum_{j=N-c}^{N-2} \tilde{I}_j\right) + I_{unit}$$

$$\tilde{I}_{N-2} = \left(\sum_{k=0}^{N-c-1} I_k\right) + \left(\sum_{j=N-c}^{N-3} \tilde{I}_j\right) + I_{unit}$$

...

$$\tilde{I}_{N-c} = \left(\sum_{k=0}^{N-c-1} I_k\right) + I_{unit}$$

in which expressions $I_k$ being the current from the current source $SI_k$, and $I_{unit}$ being the current from an additional unit current source. This method is denoted generalized MSB calibration, as it compensates for the currents $I_{N-1}, I_{N-2}, \ldots, I_{N-c}$ from the c largest current source $SI_{N-1}, SI_{N-2}, \ldots, SI_{N-c}$.

The present method may be implemented in the same manner as the method of the first aspect of the invention, but preferably the method is implemented through the following calibration procedure prior to D/A conversion:

The currents $I_{N-1}, I_{N-2}, \ldots, I_{N-c}$, and $\tilde{I}_{N-1}$ are measured;

current difference $\Delta I_{N-1} = I_{N-1} - \tilde{I}_{N-1}$ is formed; and current differences $\Delta I_{N-2} = I_{N-2} - \tilde{I}_{N-2}, \ldots, \Delta I_{N-c} = I_{N-c} - \tilde{I}_{N-c}$ are provided as fractions of $\Delta I_{N-1}$. The substitution, during conversion, comprises that the respective current $\tilde{I}_{N-1}, \tilde{I}_{N-2}, \ldots, \tilde{I}_{N-c}$, is formed by subtracting the respective current difference $\Delta I_{N-1}, \Delta I_{N-2}, \ldots, \Delta I_{N-c}$, from the respective current $I_{N-1}, I_{N-2}, \ldots, I_{N-c}$.

Preferably, the fractions are provided from prior knowledge of the relative mismatch between the N binary weighted current sources.

A further object of the present invention is to provide current-steering N-bit D/A converters, comprising N digital inputs, each receiving a digital input bit $b_i$, i=0, 1, ..., N-1, $b_{N-1}$ being the most significant bit (MSB); an analog output; and N binary weighted current sources $SI_k$, k=0, 1, ..., N-1, connectable to said analog output, each current source $SI_k$ comprising $2^k$ unit current sources, $SI_{unit}$, of equal strength connected in parallel, wherein the digital input bits are indicative of which respective current source, $SI_k$, k=0, 1, ..., N-1, to be connected to the analog output, in which the method according to the first and second aspects of the invention, may be implemented.

Consequently, there is according to a third aspect of the present invention provided such a D/A converter further comprising an additional unit current source and means for substituting the current $I_{N-1}$ from the largest current source $SI_{N-1}$ for a current $\tilde{I}_{N-1}$ where $$\tilde{I}_{N-1} = \left(\sum_{k=0}^{N-2} I_k\right) + I_{unit}$$

$I_k$ being the current from the current source $SI_k$, and $I_{unit}$ being the current from said additional unit current source.

According to a fourth aspect of the present invention there is provided such a D/A converter further comprising an additional unit current source and means for substituting the currents $I_{N-1}, I_{N-2}, \ldots, I_{N-c}$, from the c largest current sources $SI_{N-1}, SI_{N-2}, \ldots, SI_{N-c}$, c being a positive integer larger than 1, for currents $\tilde{I}_{N-1}, \tilde{I}_{N-2}, \ldots, \tilde{I}_{N-c}$, where $$\tilde{I}_{N-1} = \left(\sum_{k=0}^{N-c-1} I_k\right) + \left(\sum_{j=N-c}^{N-2} \tilde{I}_j\right) + I_{unit}$$

$$\tilde{I}_{N-2} = \left(\sum_{k=0}^{N-c-1} I_k\right) + \left(\sum_{j=N-c}^{N-3} \tilde{I}_j\right) + I_{unit}$$

$$\ldots$$

$$\tilde{I}_{N-c} = \left(\sum_{k=0}^{N-c-1} I_k\right) + I_{unit}$$

in which expressions $I_k$ being the current from the current source $SI_k$, and $I_{unit}$ being the current from said additional unit current source.

The inventive D/A converters may comprise a current mirror for the forming of above said current differences, which differences may be stored and restored in a network comprising a capacitor and transistors connected in parallel. The transistors comprise preferably both NMOS and PMOS transistors. Further, the current sources are preferably also MOS transistors.

A major advantage of the present invention is that it can be practiced in a completely analog way without introducing any A/D conversion.

Further characteristics of the invention and advantages thereof will be evident from the following detailed description of embodiments of the invention.

BRIEF DESCRIPTION OF THE DRAWINGS

The present invention will become more fully understood from the detailed description of preferred embodiments of the present invention given hereinbelow and the accompanying FIGS. 1–7, which are given by way of illustration only, and thus are not limitative of the present invention.

FIG. 1a shows schematically a current-steering D/A converter and FIG. 1b shows schematically a unit current source with a corresponding matching error.

FIG. 2a shows schematically an array of unit current sources with defined directions and positions and FIG. 2b illustrates an example of an assignment of unit sources to specific bits for a 6-bit D/A converter.

FIG. 3a is a diagram of the ramp response for the 6-bit D/A converter of FIG. 2b with matching property constants $k_x=0$ and $k_y=0.1$ without the inventive simple MSB calibration and FIG. 3b is a diagram of the ramp response for the same converter when the inventive simple MSB calibration is used.

FIG. 4a shows schematically an example of how to carry out the simple MSB calibration in a purely analog manner and FIG. 4b shows schematically how to perform the corresponding compensation during D/A conversion.

FIGS. 5a and b are diagrams of the ramp response for the 6-bit D/A converter of FIG. 2b with matching property constants $k_x=0$ and $k_y=0.1$ when the inventive generalized MSB calibration is used. FIG. 5a is an example when c is set to one (which coincides with the simple MSB calibration) and FIG. 5b is an example when c is set to two.

FIG. 7 shows four single tone spectra for a 14-bit D/A converter with matching property constants $k_x=0.0001$ and $k_y=0.0001$ for different number of calibrated bits (C=0, 1, 2, 3, respectively).

DETAILED DESCRIPTION OF EMBODIMENTS

Figure 6A:
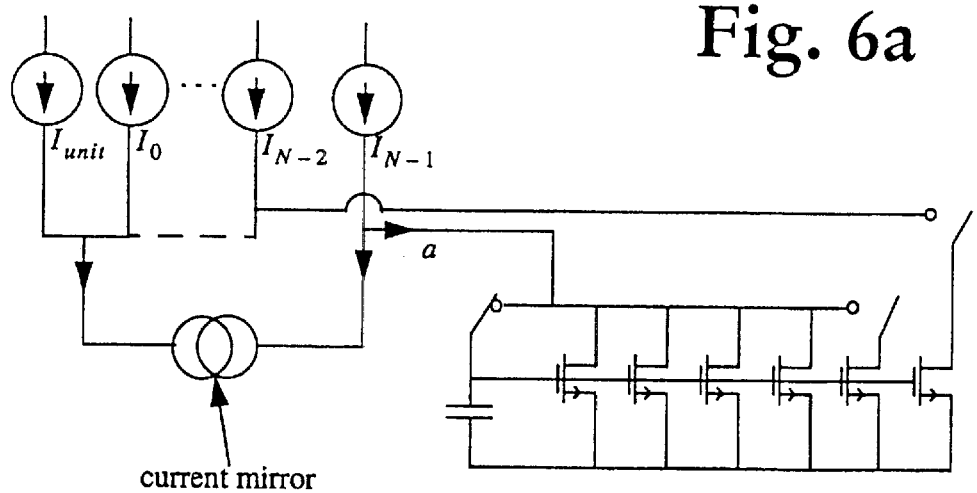
FIG. 6a shows schematically an example of how to carry out the generalized MSB calibration (c=2) in a purely analog manner and FIG. 6b shows schematically how to perform the corresponding compensation during D/A conversion.

In the following description, for purposes of explanation and not limitation, specific details are set fourth, such as particular techniques and applications in order to provide a thorough understanding of the present invention. However, it will be apparent to one skilled in the art that the present invention may be practiced in other embodiments that depart from these specific details. In other instances, detailed descriptions of well-known methods and apparatuses are omitted so as not to obscure the description of the present invention with unnecessary details.

The current-steering CMOS D/A converter, as schematically shown in FIG. 1a is suitable for high-speed and high-resolution applications. The basic structure needs no feedback loops and no operational amplifier and hence the bandwidth is large. The power efficiency is almost 100% since all current is directed to the output, where it is terminated over a resistive load (typically 50 Ohms). The N-bit D/A converter as illustrated in FIG. 1a is constructed by using N binary weighted current sources, $SI_k$, k=0, 1, ..., N–1, where source $SI_k$ generates a current $I_k$.

To improve matching, each current source $SI_k$ utilizes $2^k$ parallel unit current sources, $SI_{unit}$, each of which generates a unit current $I_{unit}$. The digital input bits $b_i$, i=0, 1, ..., N–1, choose which current sources to connect to the output. $b_0$ is the least significant bit (LSB) and $b_{N-1}$ is the most significant bit (MSB). Thus, the total output current is given by $$I_{out}(n)=(b_{N-1}(n)\cdot 2^{N-1}+ \ldots +b_1(n)\cdot 2+b_0(n))\cdot I_{unit}=X(n)\cdot I_{unit} \quad (1)$$

where X(n) is the binary input code X(n)={$b_{N-1}(n), \ldots, b_0(n)$} at the sampling instant n.

The mismatch error associated with a weighted current source $I_k$ is modeled as an additional current source with amplitude $\Delta_k$ in parallel as shown in FIG. 1b.

Further, the unit sources are arranged in an array with $2^M$ sources in the x-direction and $2^{N-M}$ sources in the y-direction, indexed as in FIG. 2a.

Modeling of the mismatch error will now be further described. As mentioned, the mismatch error associated with a weighted current source $I_k$ is modeled as an additional current source with amplitude $\Delta_k$ in parallel. The unit current sources are modeled in the same way as the binary weighted sources, hence a nominal current source in parallel with an error source $$i(a,b)=I_{unit}+\delta(a,b) \quad (2)$$

With this notation one has $$\begin{cases} I_k = 2^k \cdot I_{unit} \\ \Delta_k = \sum_{(a,b):i(a,b) \in I_k} \delta(a,b) \end{cases} \quad (3)$$

According to the article "Matching Properties of MOS Transistors", M. J. M. Pelgrom et al., *IEEE J. of Solid-State Circuits,* Vol. 24, No. 5, pp. 1433–9, October 1989, the mismatch of integrated MOS transistors can be seen as an effect of two types of parameter variations. The first kind of parameter variation is random with no correlation between transistors, and the second is deterministic variation arising from the fact that oxide thickness, ion implantation etc. often show a circular distribution over the wafer.

Studies of current-steering D/A converters (e.g. the article "A Low-Power Stereo 16-bit CMOS DIA Converter for Digital Audio", H. J. Schouwenaars et al., *IEEE J. of Solid-State Circuits,* Vol. 23, No. 6, pp. 1290–7, December 1988) show that the errors to a good approximation, vary linearly over the chip area. Assuming that this is the case one can express the error sources as $$\delta(a,b) = k_x \cdot \left(a - \frac{1}{2}sgn(a)\right) + k_y \cdot \left(b - \frac{1}{2}sgn(b)\right) \quad (4)$$

where $k_x$ and $k_y$ are constants describing the linearly graded matching properties of the unit source array. The terms ($\frac{1}{2}$)sgn(a) and ($\frac{1}{2}$)sgn(b) compensates for the fact that there are no unit sources with index a=0 or b=0. Combining Eq. (3) and Eq. (4) one can achieve values of the $\Delta_k$'s expressed in $k_x$ and $k_y$. These expressions are of course dependent on which unit sources are chosen to make up a certain binary weighted current source.

FIG. 2b shows an example of how to assign unit sources for a 6-bit D/A converter, a style that is commonly known to be bad in suppressing deterministic, linearly graded mismatch. In such arrangement, however, the different $\Delta_k$'s may easily be expressed in terms of $\Delta_{N-1}$, the error of the MSB, at least for the N–M MSB's, N and M being indexed as in FIG. 2a, something that can be used to simplify the error estimation.

Now, the inventive calibration technique will be described in terms of as simple MSB calibration with reference to FIGS. 3 and 4.

Due to the large number of unit sources in the MSB, this is probably the bit with the largest error. The idea of the simple MSB calibration is to eliminate this error with the substitution $$I_{N-1} \leftrightarrow \tilde{I}_{N-1} = \left(\sum_{k=0}^{N-2} I_k\right) + I_{unit} \quad (5)$$

$I_{unit}$ may obtained by the dummy unit source indicated in FIG. 2b. In practice there may be several unit sources available for the purpose on the chip.

FIG. 3a is a diagram of the ramp response for the 6-bit D/A converter of FIG. 2b with matching property constants $k_x$=0 and $k_y$=0.1 without the inventive simple MSB calibration and FIG. 3b is a diagram of the ramp response for the same converter when the inventive simple MSB calibration is used.

It is seen that the linearity of the D/A converter is very much increased when the large error in the transition between $2^{N-1}-1$=011 . . . $11_{binary}$ and $2^{N-1}$=100 . . . $00_{binary}$ is removed. The MSB calibration introduces though a gain error, as can be seen from FIGS. 3a and 3b (different slopes), but this does not affect the performance of the D/A converter.

The substitution of Eq. (5) can be carried out without having to measure any current. Since there is access to both $I_{N-1}$ and $\tilde{I}_{N-1}$ the current difference $\Delta I = I_{N-1} - \tilde{I}_{N-1}$ can be constructed using a current mirror as shown in FIGS. 4a and 4b. The current $\Delta I$ is stored in a current memory, and during operation $\Delta I$ is subtracted from $I_{N-1}$, making the output of the MSB current source, as also shown in FIGS. 4a and 4b.

Figure 6B:
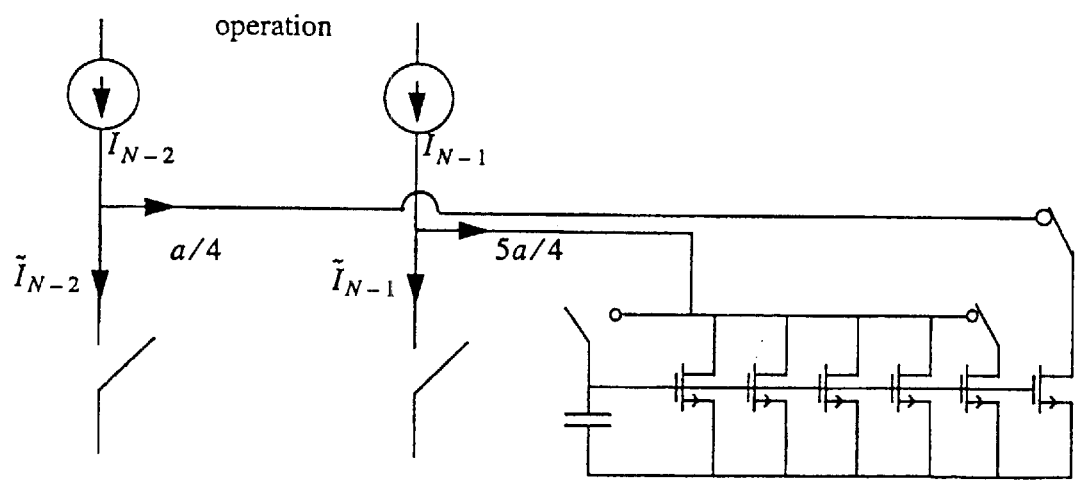

One limitation with this method may be that the current memory probably has to be a capacitor keeping a proper gate voltage of a transistor (as shown in FIGS. 6a and 6b), and this capacitor will suffer from charge leakage, making it necessary to recalibrate the D/A converter after a certain, e.g. predetermined, amount of time.

A generalized inventive MSB calibration technique will now be discussed. In FIGS. 3a and 3b it was seen a large increase in the linearity of the D/A converter with the simple MSB calibration technique, but there are still errors in the transitions of the second most significant bit, MSB-1, and the third most significant bit, MSB-2, etc., errors that also might to be reduced in order to achieve the wanted performance of the D/A converter. Assuming calibration of c bits (the simple MSB calibration corresponds to C=1), Eq. (5) is generalized to $$I_{N-c} \leftrightarrow \tilde{I}_{N-c} = \left(\sum_{k=0}^{N-c-1} I_k\right) + I_{unit} \quad (6)$$

$$I_{N-c+1} \leftrightarrow \tilde{I}_{N-c+1} = \left(\sum_{k=0}^{N-c-1} I_k\right) + \tilde{I}_{N-c} + I_{unit}$$

$$\ldots$$

$$I_{N-3} \leftrightarrow \tilde{I}_{N-3} = \left(\sum_{k=0}^{N-c-1} I_k\right) + \left(\sum_{j=N-c}^{N-4} \tilde{I}_j\right) + I_{unit}$$

$$I_{N-2} \leftrightarrow \tilde{I}_{N-2} = \left(\sum_{k=0}^{N-c-1} I_k\right) + \left(\sum_{j=N-c}^{N-3} \tilde{I}_j\right) + I_{unit}$$

$$I_{N-1} \leftrightarrow \tilde{I}_{N-1} = \left(\sum_{k=0}^{N-c-1} I_k\right) + \left(\sum_{j=N-c}^{N-2} \tilde{I}_j\right) + I_{unit}$$

In FIGS. 5a and 5b the ramp response of the same D/A converter as before is shown, this time calibrated with c=1 (same example as shown in FIG. 3b) and c=2, and as can be seen calibrating MSB-1 as well as MSB further improves the linearity of the D/A converter.

In the following two basic concepts of how to implement the generalized MSB calibration will be described. One way is to calibrate the c MSB's is to carry out the algorithm in Eq. (6) using the same kind of circuits as in FIGS. 4a and 4b to construct the different $\tilde{I}_j$'s. This might consume a lot of complex circuitry and large chip area, and therefore it can be suitable to use the knowledge of the mismatch as described in the mismatch modeling section above. Since the errors due to linearly graded mismatch can be expressed in terms of the error in the MSB, at least as a good approximation for a few MSB's, one only needs to construct this error current as performed in the simple MSB calibration, and use this current to construct all other compensation currents. As an example of this, the two MSB's for the 6-bit D/A converter previously used as an example in this description, will be calibrated. With this way of choosing unit sources it is known that the error in the MSB-1 transition, marked b in FIG. 3a, can be expressed in terms of the error in the MSB transition, marked a in FIG. 3a, as b=a/4. Using Eq. (6) one now gets:

$$\tilde{I}_{N-2} = I_{N-2} - b = I_{N-2} - \frac{a}{4} \quad (7)$$

$$\tilde{I}_{N-1} = I_{N-1} - b - a = I_{N-1} - \frac{5a}{4}$$

In FIGS. 6a and 6b below a proposed circuit to implement the calibration of Eq. (7) is shown. In the calibration phase the capacitor is charged in order for the four leftmost NMOS transistors to hold the current a, i.e. the transistors each have the drain current a/4. In the operation phase the capacitor still holds the same charge, so the transistors each have the drain current a/4. One of the transistors is used to subtract the current a/4 from $I_{N-2}$ while the other five are used to subtract the current 5a/4 from $I_{N-1}$. In order for the circuit in FIGS. 6a and b to work, a has to be a positive number. If a is negative the calibration could be carried out using the same circuit with PMOS transistor instead of NMOS ones. Since the sign of a is unknown, two calibration networks are needed, one NMOS transistor network and one PMOS transistor network, and a comparator to determine the sign of a, and thus which network to use.

Now, results in the frequency domain from simulation of D/A converters utilizing MSB calibration for different values of c will be presented with reference to FIG. 7. The D/A converter structure used is a 14-bit D/A converter constructed in the same way as the 6-bit D/A converter in FIG. 2 with M=8, and a gradient of $k_x=k_y=0.0001$ is applied [LSB/unit source]. In FIG. 7 signal spectra is shown for the D/A converter with a full-scale sinusoid on the input and for different values of C. The important frequency domain properties signal-to-noise-and-distortion-ratio (SNDR) and spurious-free-dynamic-range (SFDR) are also presented in FIG. 7. For a 14-bit D/A converter the SNDR is limited to 86 dB due to quantization noise, and calibrating the D/A converter with c=2 gives SNDR=78 dB, corresponding to an effective number of bits (ENOB) of 12.5 bits, an improvement of 3 bits in comparison to the uncompensated D/A converter.

With this very simple calibration technique a D/A converter with very high performance is achieved.

With the MSB calibration described in this description it is possible to obtain high performance of the D/A converter without complicated layout styles, randomization, or DEM techniques that are otherwise used.

The calibration can be made completely analog, and since the mismatch errors are analog in nature it is preferred not to use A/D converters and perform the calibration in a digital domain, since these A/D converters are difficult to fabricate with high precision, occupy space on the chip, and consume power.

Using the knowledge of linearly graded mismatch as described above the errors of many bits can be estimated using the error of one bit, e.g. the MSB, and the calibration circuitry can be further simplified.

An advantage of the proposed calibration technique is that the relatively small compensation current is stored and restored, rather then the relatively large MSB current. When the current memory suffers from charge leakage one will as a worst case reach the performance of an uncalibrated current-steering D/A converter. If instead the complete calibrated MSB current was stored in the current memory, charge leakage would have much worse effect on the performance of the D/A converter.

The calibration technique described herein has inter alia, the following further advantages.

Simple and effective technique.

No need for complicated layout styles, randomization, or DEM techniques.

No error measurement or A/D conversion is needed.

Calibrating the small compensation current of a reasonably well working D/A converter rather than calibrating the whole MSB current results in less errors when the calibration fail due to mismatch or charge leakage.

Further, charge leakage in the current memory may imply a need for re-calibration and mismatch also affects calibration circuitry.

It will be obvious that the invention may be varied in a plurality of ways. Such variations are not to be regarded as a departure from the scope of the invention. All such modifications as would be obvious to one skilled in the art are intended to be included within the scope of the appended claims.

What is claimed is:

1. A method for using a current-steering N-bit D/A converter comprising N binary weighted current sources $SI_k$, k=0, 1, . . . , N−1, connectable to a common output, each current source $SI_k$ comprising $2^k$ unit current sources, $SI_{unit}$, of equal strength connected in parallel, wherein digital input bits $b_i$, i=0, 1, . . . , N−1, $b_{N-1}$ being the most significant bit (MSB), determine which respective current source, $SI_k$, k=0, 1, . . . , N−1, to be connected to the output, the method comprising the step of:

during D/A conversion substituting the current $I_{N-1}$ from the largest current source $SI_{N-1}$ for a current $\tilde{I}_{N-1}$, where $$\tilde{I}_{N-1} = \left(\sum_{k=0}^{N-2} I_k\right) + I_{unit}$$

in which expression $I_k$ being the current from the current source $SI_k$, and $I_{unit}$ being the current from an additional unit current source.

2. The method as claimed in claim 1 comprising calibrating the D/A converter prior to D/A conversion, said calibrating comprising the steps of:

measuring the currents $I_{N-1}$ and $\tilde{I}_{N-1}$; and constructing the current difference ΔI between the measured currents, where in the step of substituting comprises forming the current $\tilde{I}_{N-1}$ by subtracting the current difference ΔI from the current $I_{N-1}$ of the largest current source.

3. The method as claimed in claim 2 wherein the current difference ΔI is stored in a current memory.

4. The method as claimed in claim 3 wherein the current difference ΔI is stored by charging a capacitor.

5. The method as claimed in claim 2 wherein the current difference ΔI is constructed by means of a current mirror.

6. The method as claimed in claim 2 wherein the calibration is repeated after a predetermined amount of time.

7. The method as claimed in claim 1 wherein the current sources are integrated MOS transistors.

8. A method for using a current-steering N-bit D/A converter comprising N binary weighted current sources $SI_k$, k=0, 1, . . . , N−1, connectable to a common output, each current source $SI_k$ comprising $2^k$ unit current sources, $SI_{unit}$, of equal strength connected in parallel, wherein digital input bits $b_i$, i=0, 1, . . . , N−1, $b_{N-1}$ being the most significant bit (MSB), determine which respective current source, $SI_k$, k=0, 1, ..., N–1, to be connected to the output, the method comprising the step of:

during D/A conversion substituting the currents $I_{N-1}$, $I_{N-2}$, ..., $I_{N-c}$, from the c largest current sources $SI_{N-1}$, $SI_{N-2}$, ..., $SI_{N-c}$, c being a positive integer larger than 1, for currents $\tilde{I}_{N-1}, \tilde{I}_{N-2}, ..., \tilde{I}_{N-c}$, where $$\tilde{I}_{N-1} = \left(\sum_{k=0}^{N-c-1} I_k\right) + \left(\sum_{j=N-c}^{N-2} \tilde{I}_j\right) + I_{unit}$$

$$\tilde{I}_{N-2} = \left(\sum_{k=0}^{N-c-1} I_k\right) + \left(\sum_{j=N-c}^{N-3} \tilde{I}_j\right) + I_{unit}$$

...

$$\tilde{I}_{N-c} = \left(\sum_{k=0}^{N-c-1} I_k\right) + I_{unit}$$

in which expressions $I_k$ being the current from the current source $SI_k$, and $I_{unit}$ being the current from an additional unit current source.

9. The method as claimed in claim 8 comprising calibrating the D/A converter prior to D/A conversion, said calibrating comprising the steps of:

measuring the currents $I_{N-1}, I_{N-2}, ..., I_{N-c}$, and $\tilde{I}_{N-1}, \tilde{I}_{N-2}, ..., \tilde{I}_{N-c}$; and constructing current differences $\Delta I_{N-1} = I_{N-1} - \tilde{I}_{N-1}, \Delta I_{N-2} = I_{N-2} - \tilde{I}_{N-2}, ..., \Delta I_{N-c} = I_{N-c} - \tilde{I}_{N-c}$ wherein the step of substituting comprises forming the respective current $\tilde{I}_{N-1}, \tilde{I}_{N-2}, ..., \tilde{I}_{N-c}$, by subtracting the respective current difference $\Delta I_{N-1}, \Delta I_{N-2}, ..., \Delta I_{N-c}$ from the respective current $I_{N-1}, I_{N-2}, ..., I_{N-c}$.

10. The method as claimed in claim 9 wherein the current differences $\Delta I_{N-1}, \Delta I_{N-2}, ..., \Delta I_{N-c}$ are stored in a current memory.

11. The method as claimed in claim 10 wherein the current difference $\Delta I_{N-1}$ is stored by charging a capacitor.

12. The method as claimed in claim 11 wherein the current differences $\Delta I_{N-1}, \Delta I_{N-2}, ..., \Delta I_{N-c}$, are restored for the forming of the respective current $\tilde{I}_{N-1}, \tilde{I}_{N-2}, ..., \tilde{I}_{N-c}$ by means of the capacitor controlling transistors connected in parallel.

13. The method as claimed in claim 12 wherein the transistors are NMOS transistors in dependence on the current differences $\Delta I_{N-1}, \Delta_{N-2}, ..., \Delta I_{N-c}$ being positive.

14. The method as claimed in claim 12 wherein the transistors are PMOS transistors in dependence on the current differences $\Delta I_{N-1}, \Delta I_{N-2}, ..., \Delta I_{N-c}$ being negative.

15. The method as claimed in claim 9 wherein the current difference $\Delta I_{N-1}$ is constructed by means of a current mirror.

16. The method as claimed in claim 8 comprising calibrating the D/A converter prior to D/A conversion, said calibrating comprising the steps of:

measuring the currents $I_{N-1}, I_{N-2}, ..., I_{N-c}$, and $\tilde{I}_{N-1}$;

constructing a current difference $\Delta I_{N-1} = I_{N-1} - \tilde{I}_{N-1}$; and providing current differences $\Delta I_{N-2} = I_{N-2} - \tilde{I}_{N-2}, ..., \Delta I_{N-c} = I_{N-c} - \tilde{I}_{N-c}$, as fractions of $\Delta I_{N-1}$, wherein the step of substituting comprises forming the respective current $\tilde{I}_{N-1}, \tilde{I}_{N-2}, ..., \tilde{I}_{N-c}$ by subtracting the respective current difference $\Delta I_{N-1}, \Delta I_{N-2}, ..., \Delta I_{N-c}$, from the respective current $I_{N-1}, I_{N-2}, ..., I_{N-c}$.

17. The method as claimed in claim 16 wherein the fractions are provided by means of prior knowledge of the relative mismatch between the N binary weighted current sources of the D/A converter.

18. The method as claimed in claim 16 wherein the calibration is repeated after a predetermined amount of time.

19. The method as claimed in claims 16 wherein the current sources are integrated MOS transistors.

20. A current-steering N-bit D/A converter comprising:

N digital inputs, each receiving a digital input bit $b_i$, i=0, 1, ..., N–1, $b_{N-1}$ being the most significant bit (MSB);

an analog output; and

N binary weighted current sources $SI_k$, k=0, 1, ..., N–1, connectable to said analog output, each current source $SI_k$ comprising $2^k$ unit current sources, $SI^{unit}$, of equal strength connected in parallel, wherein the digital input bits are indicative of which respective current source, $SI_k$, k=0, 1, ..., N–1, to be connected to the analog output, the D/A converter further comprising an additional unit current source and means for substituting the current $I_{N-1}$ from the largest current source $SI_{N-1}$ for a current $\tilde{I}_{N-1}$, where $$\tilde{I}_{N-1} = \left(\sum_{k=0}^{N-2} I_k\right) + I_{unit}$$

in which expression $I_k$ being the current from the current source $SI_k$, and $I_{unit}$ being the current from said additional unit current source.

21. The D/A converter as claimed in claim 20 comprising calibration means for calibrating the D/A, said calibration means comprising:

means for measuring the currents $I_{N-1}$ and $\tilde{I}_{N-1}$; and means for constructing the current difference $\Delta I$ between the measured currents, wherein the D/A converter comprises means for, during D/A conversion, forming the current $\tilde{I}_{N-1}$ by subtracting the current difference $\Delta I$ from the current $I_{N-1}$ of the largest current source.

22. The D/A converter as claimed in claim 21 wherein the means for constructing comprises a current mirror.

23. The D/A converter as claimed in claim 21 wherein the current difference $\Delta I$ is held in a current memory, particularly comprising a capacitor.

24. The D/A converter as claimed in claim 20 wherein the current sources are integrated MOS transistors.

25. A current-steering N-bit D/A converter comprising:

N digital inputs, each receiving a digital input bit $b_i$, i=0, 1, ..., N–1, $b_{N-1}$ being the most significant bit (MSB);

an analog output; and

N binary weighted current sources $SI_k$, k=0, 1, ..., N–1, connectable to said analog output, each current source $SI_k$ comprising $2^k$ unit current sources, $SI_{Unit}$, of equal strength connected in parallel, wherein the digital input bits are indicative of which respective current source, $SI_k$, k=0, 1, ..., N–1, to be connected to the analog output, the D/A converter further comprising an additional unit current source and means for substituting the currents $I_{N-1}, I_{N-2}, I_{N-c}$, from the c largest current sources $SI_{N-1}, SI_{N-2}, ..., SI_{N-c}$, c being a positive integer larger than 1, for currents $\tilde{I}_{N-1}, \tilde{I}_{N-2}, \tilde{I}_{N-c}$, where $$\tilde{I}_{N-1} = \left(\sum_{k=0}^{N-c-1} I_k\right) + \left(\sum_{j=N-c}^{N-2} \tilde{I}_j\right) + I_{unit}$$

$$\tilde{I}_{N-2} = \left(\sum_{k=0}^{N-c-1} I_k\right) + \left(\sum_{j=N-c}^{N-3} \tilde{I}_j\right) + I_{unit}$$

...

$$\tilde{I}_{N-c} = \left(\sum_{k=0}^{N-c-1} I_k\right) + I_{unit}$$

in which expressions $I_k$ being the current from the current source $SI_k$, and $I_{unit}$ being the current from said additional unit current source.

26. The D/A converter as claimed in claim 25 comprising means for calibrating the D/A converter, said calibrating means comprising:
means for measuring the currents $I_{N-1}, I_{N-2}, \ldots, I_{N-c}$, and $\tilde{I}_{N-1}, \tilde{I}_{N-2}, \ldots, \tilde{I}_{N-c}$; and
means for constructing current differences, $\Delta I_{N-2} = I_{N-2} - \tilde{I}_{N-2}, \ldots, \Delta I_{N-c} = I_{N-c} - \tilde{I}_{N-c}$ wherein
the means for substituting comprises means for forming the respective current $\tilde{I}_{N-1}, \tilde{I}_{N-2}, \ldots, \tilde{I}_{N-c}$, by subtracting the respective current difference $\Delta I_{N-1}, \Delta I_{N-2}, \ldots, \Delta I_{N-c}$ from the respective current $I_{N-1}, I_{N-2}, \ldots, I_{N-c}$.

27. The D/A converter as claimed in claim 26 wherein the means for forming comprises a capacitor and transistors connected in parallel.

28. The D/A converter as claimed in claim 27 wherein the transistors comprise NMOS transistors.

29. The D/A converter as claimed in claim 27 wherein the transistors comprise PMOS transistors.

30. The D/A converter as claimed in claim 26 wherein the means for constructing comprises a current mirror.

31. The D/A converter as claimed in claim 25 comprising means for calibrating the D/A converter, said calibrating means comprising:
means for measuring the currents $I_{N-1}, I_{N-2}, \ldots, I_{N-c}$, and $\tilde{I}_{N-1}$;
means for constructing current difference $\Delta I_{N-1} = I_{N-1} - \tilde{I}_{N-1}$; and
means for providing current differences $\Delta I_{N-2} = I_{N-2} - \tilde{I}_{N-2}, \ldots, \Delta I_{N-c} = I_{N-c} - \tilde{I}_{N-c}$, as fractions of $\Delta I_{N-1}$, wherein
the means for substituting comprises means for forming the respective current $\tilde{I}_{N-1}, \tilde{I}_{N-2}, \ldots, \tilde{I}_{N-c}$, by subtracting the respective current difference $\Delta I_{N-1}$, [<b>old66 $I_{N-2}, \ldots \Delta I_{N-c}$, from the respective current $I_{N-1}, I_{N-2}, \ldots, I_{N-c}$.

32. The D/A converter as claimed in claim 31 wherein the means for providing the fractions are constructed by means of prior knowledge of the relative mismatch between the N binary weighted current sources.

33. The D/A converter as claimed in claim 25 wherein the current sources are integrated MOS transistors.

* * * * *